United States Patent
Hsiao et al.

(10) Patent No.: US 11,245,176 B2
(45) Date of Patent: *Feb. 8, 2022

(54) PACKAGE STRUCTURE, ELECTRONIC DEVICE AND METHOD OF FABRICATING PACKAGE STRUCTURE

(71) Applicant: Taiwan Semiconductor Manufacturing Co., Ltd., Hsinchu (TW)

(72) Inventors: Min-Chien Hsiao, Taichung (TW); Chen-Hua Yu, Hsinchu (TW); Chung-Shi Liu, Hsinchu (TW); Chao-Wen Shih, Hsinchu County (TW); Shou-Zen Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/740,464

(22) Filed: Jan. 12, 2020

(65) Prior Publication Data

US 2020/0153083 A1     May 14, 2020

Related U.S. Application Data

(60) Continuation of application No. 16/396,769, filed on Apr. 29, 2019, now Pat. No. 10,535,913, which is a
(Continued)

(51) Int. Cl.
*H01L 23/498*     (2006.01)
*H01Q 1/22*     (2006.01)
(Continued)

(52) U.S. Cl.
CPC ......... *H01Q 1/2283* (2013.01); *H01L 21/561* (2013.01); *H01L 21/568* (2013.01);
(Continued)

(58) Field of Classification Search
CPC .... H01Q 1/2283; H01Q 1/243; H01L 21/561; H01L 21/568; H01L 21/6835; H01L 23/3114; H01L 23/49838; H01L 23/66
See application file for complete search history.

(56) References Cited

U.S. PATENT DOCUMENTS 9,153,863 B2 * 10/2015 Nair .................... H01Q 1/38
10,276,920 B2 * 4/2019 Hsiao ................ H01L 21/6835
(Continued)

*Primary Examiner* — Nathan W Ha
(74) *Attorney, Agent, or Firm* — JCIPRNET

(57) ABSTRACT

In accordance with some embodiments, a package structure includes an RFIC chip, an insulating encapsulation, a redistribution circuit structure, an antenna and a microwave director. The insulating encapsulation encapsulates the RFIC chip. The redistribution circuit structure is disposed on the insulating encapsulation and electrically connected to the RFIC chip. The antenna is disposed on the insulating encapsulation and electrically connected to the RFIC chip through the redistribution circuit structure. The antenna is located between the microwave director and the RFIC chip. The microwave director has a microwave directivity enhancement surface located at a propagating path of a microwave received or generated by the antenna.

20 Claims, 16 Drawing Sheets

Related U.S. Application Data division of application No. 15/717,976, filed on Sep. 28, 2017, now Pat. No. 10,276,920.

(51) Int. Cl.
| | |
|---|---|
| *H01L 23/66* | (2006.01) |
| *H01L 21/56* | (2006.01) |
| *H01L 23/31* | (2006.01) |
| *H01Q 1/24* | (2006.01) |
| *H01Q 9/04* | (2006.01) |
| *H01Q 19/06* | (2006.01) |
| *H01Q 25/00* | (2006.01) |
| *H01L 21/683* | (2006.01) |
| *H01Q 21/06* | (2006.01) |
| *H01Q 21/29* | (2006.01) |

(52) U.S. Cl.
CPC ...... *H01L 21/6835* (2013.01); *H01L 23/3114* (2013.01); *H01L 23/49838* (2013.01); *H01L 23/66* (2013.01); *H01Q 1/243* (2013.01); *H01Q 9/0407* (2013.01); *H01Q 19/062* (2013.01); *H01Q 25/00* (2013.01); *H01L 23/3128* (2013.01); *H01L 2221/68331* (2013.01); *H01L 2221/68345* (2013.01); *H01L 2223/6683* (2013.01); *H01L 2224/18* (2013.01); *H01L 2224/97* (2013.01); *H01Q 21/065* (2013.01); *H01Q 21/29* (2013.01)

(56) References Cited

U.S. PATENT DOCUMENTS

| | | | |
|---|---|---|---|
| 2007/0125489 A1* | 6/2007 | Paul | B29C 65/1635 156/272.8 |
| 2010/0164671 A1* | 7/2010 | Pagani | H01L 25/0657 336/200 |
| 2014/0002188 A1* | 1/2014 | Chen | H03F 3/195 330/250 |
| 2017/0237154 A1* | 8/2017 | Choudhury | H01Q 1/38 343/824 |
| 2017/0245317 A1* | 8/2017 | Lee | H04B 7/04 |
| 2017/0324160 A1* | 11/2017 | Khoury | H01Q 1/2283 |
| 2018/0219087 A1* | 8/2018 | Dasgupta | H01L 21/0265 |
| 2019/0067220 A1* | 2/2019 | Wan | H01L 23/66 |
| 2019/0103652 A1* | 4/2019 | Chuang | H01L 24/20 |

* cited by examiner

PACKAGE STRUCTURE, ELECTRONIC DEVICE AND METHOD OF FABRICATING PACKAGE STRUCTURE

CROSS-REFERENCE TO RELATED APPLICATION

This application is a continuation application of and claims the priority benefit of a prior application Ser. No. 16/396,769, filed on Apr. 29, 2019, now allowed. The prior application Ser. No. 16/396,769 is a divisional application of and claims the priority benefit of a prior application Ser. No. 15/717,976, filed on Sep. 28, 2017, now patented. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, a technique of integrated fan-out (INFO) packages having more compactness is developed and utilized in various package applications.

For example, the INFO package is utilized for packaging a radio frequency integrated circuit (RFIC) chip with an integrated antenna. However, the performance of the antenna still need be improved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
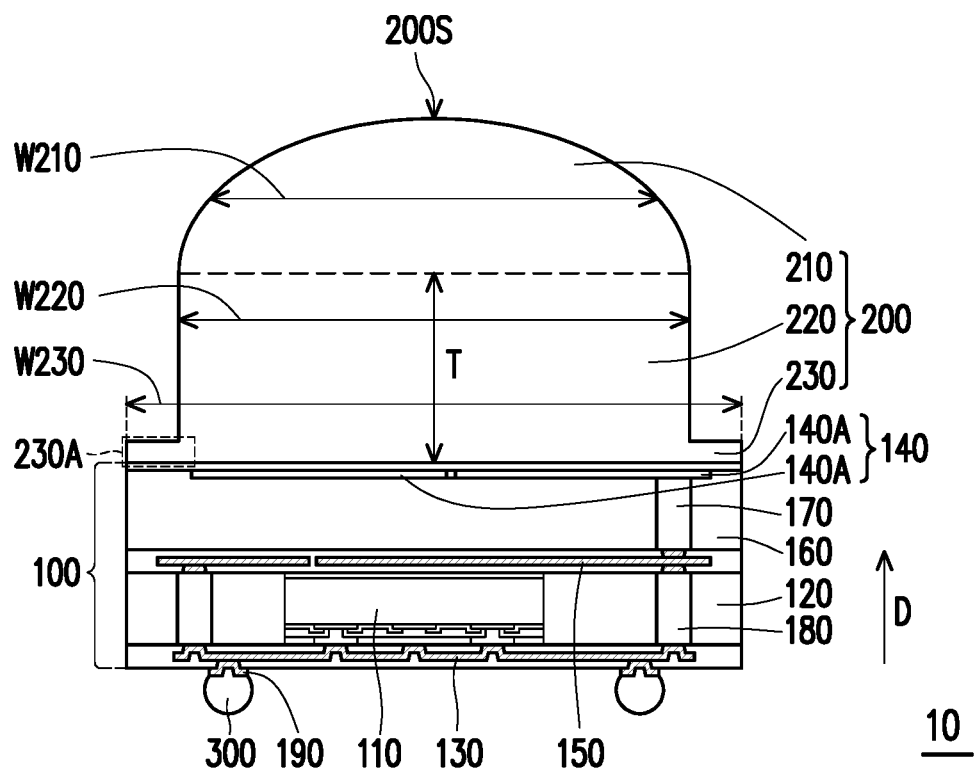
FIG. 1 schematically illustrates a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 schematically illustrates a package structure in accordance with some embodiments of the disclosure. In FIG. 1, the package structure 10 includes an integrated fan-out (INFO) package 100 and a microwave director 200 disposed on the INFO package 100. The INFO package 100 may at least include a radio frequency integrated circuit (RFIC) chip 110, an insulating encapsulation 120, a redistribution circuit structure 130, and an antenna 140. The insulating encapsulation 120 encapsulates the RFIC chip 110. The redistribution circuit structure 130 is disposed on the insulating encapsulation 120 and electrically connected to the RFIC chip 110. The antenna 140 is disposed on the insulating encapsulation 120, where the antenna 140 is disposed to be located between the RFIC chip 110 and the microwave director 200 and the antenna 140 is electrically connected to the RFIC chip 110 through the redistribution circuit structure 130. In other words, the RFIC chip 110 and the antenna 140 are integrated in the INFO package 100. The microwave director 200 has a microwave directivity enhancement surface 200S located at a propagating path of a microwave received or generated by the antenna 140. In some embodiments, the microwave directivity enhancement surface 200S may be able to direct the propagating path of the microwave received or generated by the antenna 140 and enhance the antenna gain of the antenna 140.

In certain embodiments, the INFO package 100 may further include a backside redistribution circuit structure 150, an isolation layer 160, a through via 170, a through via 180, and a connecting pad 190 as illustrated in FIG. 1. The backside redistribution circuit structure 150 is located between the antenna 140 and the RFIC chip 110. The isolation layer 160 is disposed between the antenna 140 and the backside redistribution circuit structure 150. The isolation layer 160 is formed between the antenna 140 and the backside redistribution circuit structure 150. In some embodiments, a material of the isolation layer 160 may have low dissipation factor (Df). For example, the Df of the isolation layer 160 may be lower than that of the insulating encapsulation 120. Alternatively, the Df of the isolation layer 160 may be not greater than 0.01. In some alternative embodiments, a material of the isolation layer 160 may be the same as a material of the insulating encapsulation 120. The backside redistribution circuit structure 150 may be electrically connected to the antenna 140 through the through via 170 to serve as a feed line circuit and may include a ground plane (not shown) opposite to the antenna 140. The redistribution circuit structure 130 may be electrically connected to the backside redistribution circuit structure 150 through the through via 180, such that the antenna 140 may be electrically connected to the RFIC chip 110 through the redistribution circuit structure 130. The insulating encapsulation 120 is formed between the backside redistribution circuit structure 150 and the redistribution circuit structure 130 to encapsulate the RFIC chip 110. The connecting pad 190 is formed to be electrically connected to the redistribution circuit structure 130 and is exposed at a side of the INFO package 100. A conductive bump 300 may be formed on the connecting pad 190 for bonding to an external component such as a circuit board. In some alternative embodiments, the antenna 140 may be integrated in the INFO package 100 in an alternative manner. Specifically, the antenna 140 may be formed by the conductive layer in the backside redistribution circuit structure 150 such that the isolation layer 160 and the through via 170 shown in FIG. 1 may be omitted. In some further embodiments, a ground plane (not shown) may be disposed opposite to the antenna 140 and t antenna 140 and/or the ground plane may be formed by the conductive layers in the backside redistribution circuit structure 150 such that the isolation layer 160 and the through via 170 shown in FIG. 1 may be omitted.

The microwave director 200 may include a lens portion 210, an extension portion 220 and a base portion 230, and may be made of a dielectric material such as PMMA (Poly(methyl methacrylate)), PC (polycarbonate), epoxy, etc. In some alternative embodiments, the microwave director 200 may be made of a materiel capable of permitting a microwave to pass it through and directing the propagating direction of the microwave. The extension portion 220 is located between the lens portion 210 and the base portion 230, and the base portion 230 is located between the extension portion 220 and the antenna 140. In other words, the base portion 230, the extension portion 220 and the lens portion 210 are stacked in turn on the antenna 140 of the INFO package 100. The lens portion 210 is a portion of the microwave director 200 relatively farther from the antenna 140 of the INFO package 100 than the rest portions. In some embodiments, the lens portion 210, the extension portion 220 and the base portion 230 may be formed integrally, but the disclosure is not limited thereto. A thickness of the base portion 230 and the extension portion 220 helps to keep a distance T between the lens portion 210 and the antenna 140 of the INFO package 100. The distance T between the lens portion 210 and the antenna 140 of the INFO package 100 may be adjusted based on the design (the power, the frequency, the size, etc.) of the antenna 140. For example, the distance T between the lens portion 210 and the antenna 140 may be greater than 0 and smaller than or equal to 1.5 times of the diameter of the lens portion 210. In an instance, for an INFO package having a size of 16 mm×16 mm, the thickness of the base portion 230 and the extension portion 220 may be 5.6 mm, but the disclosure is not limited thereto. In an alternative embodiment, an INFO package having a size of 15 mm×15 mm may include an antenna distributed in an area of 13 mm×13 mm and the microwave director disposed on such INFO package may have a height of 12.5 mm and an area not greater than 15 mm×15 mm. In a case such INFO package is disposed with a microwave director thereon, the antenna gain may be greater than 25 dBi. By contrast, in the case such INFO package is not provided with a microwave director, the antenna gain may be less than 20 dBi, for example 15.6 dBi.

In certain embodiments, a width W210 of the lens portion 210 may not be constant and may be gradually reduced in a direction D away from the antenna 140. The lens portion 210 of the microwave director 200 has the microwave directivity enhancement surface 200S capable of directing the propagating path of the microwave received or generated by the antenna 140. In some embodiments, the propagating path of the microwave received or generated by the antenna 140 may be more concentrated in a predetermined direction by passing through the microwave directivity enhancement surface 200S. As such, the directivity of the microwave may be enhances by the microwave directivity enhancement surface 200S so as to enhance the efficiency of the antenna 140. In some embodiments, the lens portion 210 has a dome-like shape, and the microwave directivity enhancement surface 200S may be a spherical surface or an aspherical surface. In some alternative embodiments, the lens portion 210 may have a Fresnel lens structure and may include multiple curved surface sections serving as the microwave directivity enhancement surface. The curvature of the microwave directivity enhancement surface 200S may be adjusted based on the design (the power, the frequency, the size, etc.) of the antenna 140. The lens portion 210 may be aligned with the geometry of the antenna 140 in some embodiments, but the disclosure is not limiter thereto. In some alternative embodiments, the antenna 140 may include a plurality of patches 140A, where the microwave directivity enhancement surface 200S substantially covers the patches 140A of the antenna 140. In the top view, the patches 140A may be located within the area of an orthogonal projection of the microwave directivity enhancement surface 200S on a plane of the antenna 140.

The width W210 of the lens portion 210 may be not greater than a width W220 of the extension portion 220. In some embodiments, the width W220 of the extension portion 220 may be substantially constant and a greatest width of the width W210 of the lens portion 210 may be identical to the width W220 of the extension portion 220 so that there is no sharp alternation of width between the lens portion 210 and the extension portion 220. In other words, the microwave director 200 may have a smooth outline at the boundary between the lens portion 210 and the extension portion 220. In some alternative embodiments, the width W220 of the extension portion 220 may not be limited to be constant. The lens portion 210 and the extension portion 220 may be defined based on the altering rates of width. For example, the lens portion 210 may be defined as a portion having higher altering rate of width and the extension portion 220 may be defined as a portion having lower altering rate of width.

Figure 2:
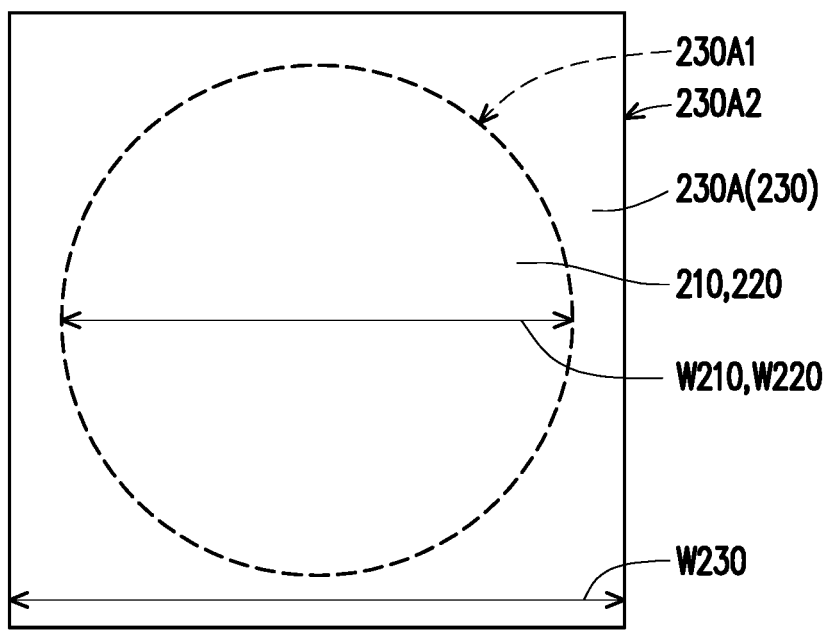
FIG. 2 schematically illustrates a top view of the microwave director in accordance with some embodiments of the disclosure.

In some embodiments, a width W230 of the base portion 230 is larger than the width W220 of the extension portion 220. The base portion 230 may be a widest portion of the microwave director 200. The base portion 230 may include a flange portion 230A exceeding the extension portion 220. FIG. 2 schematically illustrates a top view of the microwave director in accordance with some embodiments of the disclosure. As shown in FIG. 2, from the top view, the flange portion 230A of the base portion 230 may have an inner periphery 230A1 and an outer periphery 230A2. In some embodiments, the outer periphery of the lens portion 210 may be aligned with the inner periphery 230A1 of the base portion 230. An area of the microwave directivity enhancement surface 200S may be located within the area surrounded by the inner periphery 230A1 of the flange portion 230A. In the case the area surrounded by the inner periphery 230A1 of the flange portion 230A is A1 and the area surrounded by the outer periphery 230A2 of the flange portion 230A is A2, A1≤A2. In some embodiments, the relationship of A1 and A2 may be 0.5*A2≤A1≤A2. In some alternative embodiments, the outer periphery 230A2 may be aligned with the edge of the INFO package 100 as shown in FIG. 1 such that the size of the microwave director 200 may be identical to the size of the INFO package 100, or shrink from the edge of the INFO package 100 such that the size of the microwave director 200 may be smaller than the size of the INFO package 100. The size may represent the area surrounded by the outermost periphery of each component measured in the top view in which the X-Y plane is seen.

Figure 3:
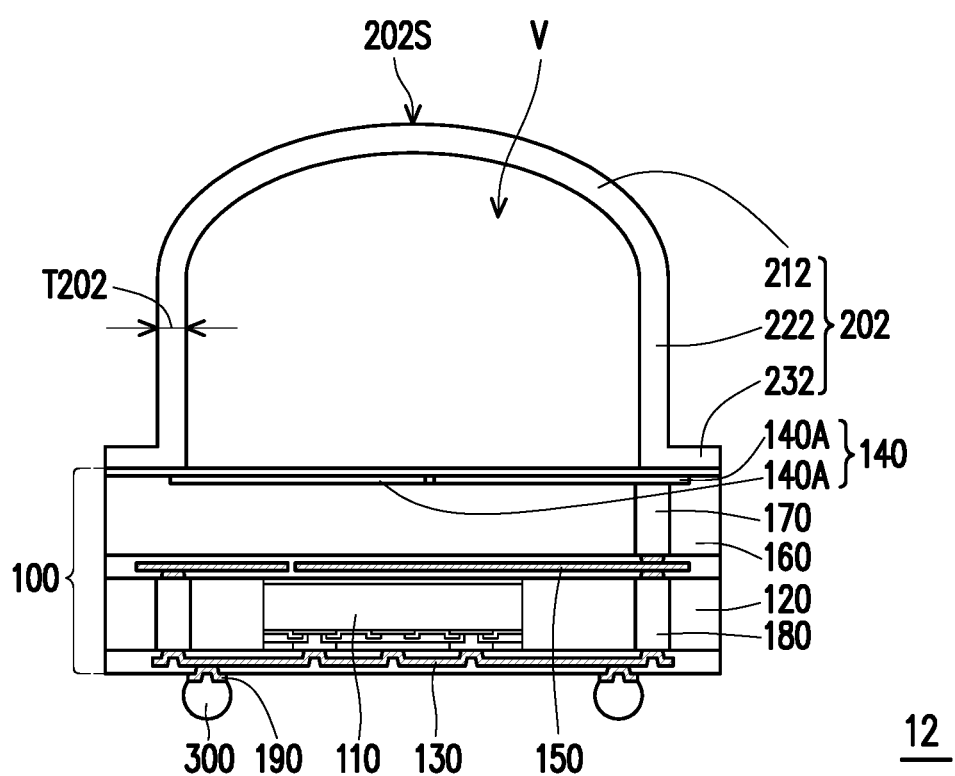
FIG. 3 schematically illustrate a package structure in accordance with some embodiments of the disclosure.

FIG. 3 schematically illustrates a package structure in accordance with some embodiments of the disclosure. In FIG. 3, an INFO package structure 12 includes an INFO package 100 and a microwave director 202 disposed on the INFO package 100. The INFO package 100 may be substantially similar to the INFO package 100 described in FIG. 1 and includes an RFIC chip 110, an insulating encapsulation 120, a redistribution circuit structure 130, an antenna 140, a backside redistribution circuit structure 150, an isolation layer 160, a through via 170, a through via 180, and a connecting pad 190, wherein a conductive bump 300 may be formed on the connecting pad 190 for bonding to an external component such as a circuit board. The antenna 140 is disposed to be located between the RFIC chip 110 and the microwave director 202 and the microwave director 202 is substantially located at a propagating path of a microwave received or generated by the antenna 140. In some embodiments, the microwave director 202 may have a structure capable of directing the propagating path of the microwave received or generated by the antenna 140 and enhancing the antenna gain of the antenna 140. In addition, the microwave director 202 may be hollow and a hollow space V is demarcated by the microwave director 202.

The microwave director 202 may have a shell shape and made of dielectric material. The microwave director 202 may include a lens portion 212, an extension portion 222 and a base portion 232, where the base portion 232 is located between the INFO package 100 and the extension portion 222, and the extension portion 222 is located between the base portion 232 and the lens portion 212. The lens portion 212 may have a spherical or an aspherical cap-like shape such that the microwave director 202 may include a microwave directivity enhancement surface 202S capable of directing the propagating path of the microwave received or generated by the antenna 140. The extension portion 222 may have a cylinder shape extending toward the INFO package 100 from the lens portion 212. The extension portion 222 may keep a distance between the antenna 140 and the microwave directivity enhancement surface 202S. The base portion 232 may extend laterally to exceed the extension portion 222. In some embodiments, the base portion 232 laterally exceeding the extension portion 222 is conducive to ensure the connection between the microwave director 202 and the INFO package 100. The microwave director 202 having a shell shape may have a thickness T202. In some embodiments, the thickness T202 may be constant so that the inner surface and the outer surface of the microwave director 202 may be conformal, but the disclosure is not limited thereto. In some alternative embodiments, the thickness T202 at the lens portion 212 may be different from that at the extension portion 222. Alternatively, the thickness T202 at the lens portion 212 may be inconsistent.

Figure 4:
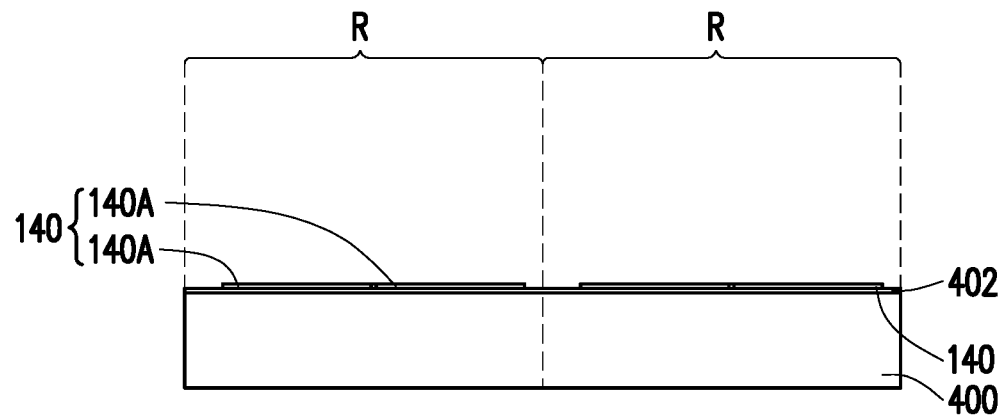
FIG. 4 to FIG. 16 schematically illustrate a process of the method of fabricating a package structure in accordance with some embodiments of the disclosure.

FIG. 4 to FIG. 16 schematically illustrate a process of the method of fabricating a package structure in accordance with some embodiments of the disclosure. Referring to FIG. 4, a carrier 400 having a plurality of unit regions R is provided. A dielectric layer 402 and an antenna 140 are formed on the carrier 400 at a respective unit region R. In some embodiments, the carrier 400 may be a substrate with sufficient rigidity or stiffness for providing a solid stand for the subsequent process. The carrier 400 may be, but not limited to a glass substrate. In some embodiments, the carrier 400 may be removed from the device formed thereon so as to finish the final device and thus a temporary adhesive layer not shown may be formed on the carrier 400 for connecting the dielectric layer 402 and the carrier 400 during fabrication. The temporary adhesive layer may be made of glue material or formed by a plurality of layers including at least one glue layer and at least one polymer layer. In some embodiments, the antenna 140 in each unit region R may include a plurality of patches 140A, but the disclosure is not limited thereto. The structure and pattern of the antenna 140 may be determined based on the product design requirements. In some embodiments, a metal layer is formed on the dielectric layer 402 by chemical vapor deposition (CVD), physical vapor deposition (PVD), atomic layer deposition (ALD), high density plasma CVD (HDPCVD), other suitable methods, and/or combinations thereof and the metal layer is patterned to form the antenna 140.

Figure 5:
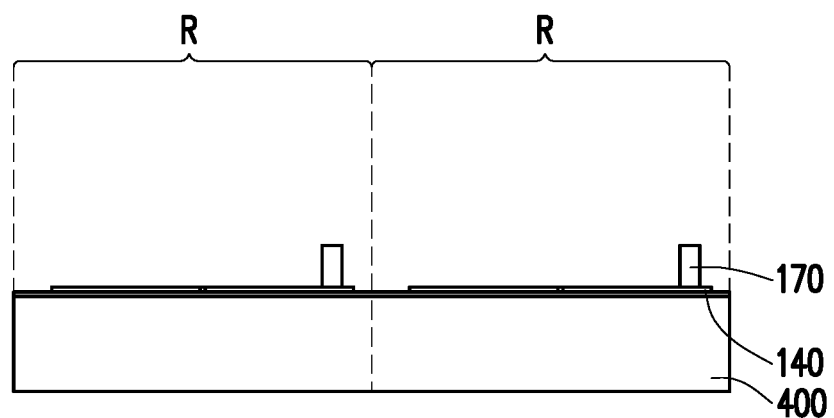

Referring to FIG. 5, a through via 170 is formed on the antenna 140 in each unit region R. In some embodiments, the through via 170 may be fabricated by the following process. A patterned layer (not shown) having openings is formed on the carrier 400, and the openings of the patterned layer may expose a portion of the antenna 140. Subsequently, a conductive material fills into the openings of the pattern layer to form the through via 170 by chemical vapor deposition (CVD), physical vapor deposition (PVD), atomic layer deposition (ALD), high density plasma CVD (HDPCVD), plating, other suitable methods, and/or combinations thereof. The conductive material includes, for example, titanium, tungsten, aluminum, copper, metal alloys, metal silicide, other suitable materials, and/or combinations thereof. In some embodiment, the thickness of the pattern layer may be determined based on the required height of the through via 170. Subsequent to the formation of the through via 170, the pattern layer is removed such that the structure as shown in FIG. 5 is achieved.

Figure 6:
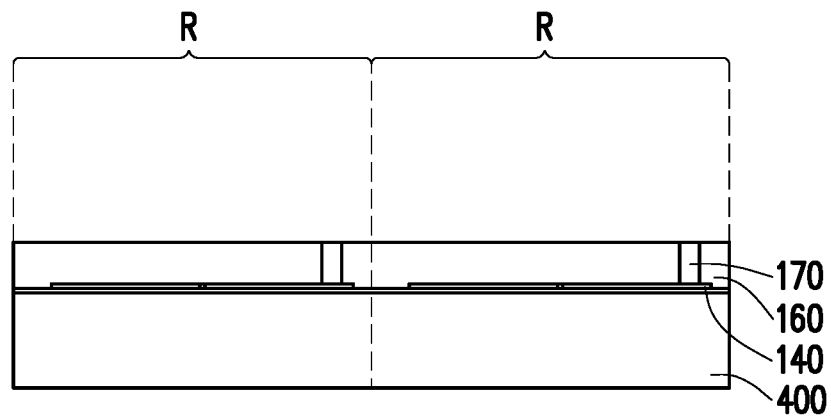

In FIG. 6, an isolation layer 160 is formed on the carrier 400. The isolation layer 160 covers the antenna 140 and surrounds the through via 170. A material of the isolation layer 160 may be dielectric material allowing the microwave to pass it through. In some embodiments, the isolation layer 160 may have low Df. In some alternative embodiments, a material of the isolation layer 160 may be a resin capable of being cured through a thermal cure process or UV cure process. Subsequent to the formation of the isolation layer 160, a planarization process may be performed so that the surface of the isolation layer 160 is planar and the through via 170 is exposed. In some embodiments, the planarization process includes a Chemical-Mechanical Planarization (CMP), a polishing process or the like.

Figure 7:
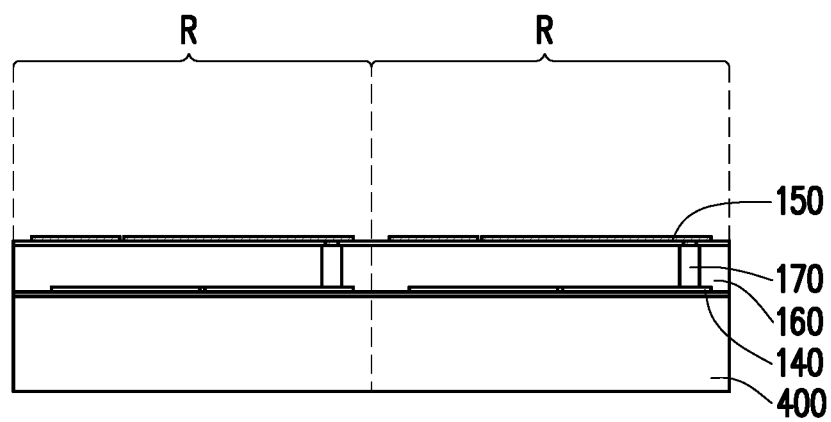

In FIG. 7, a backside redistribution circuit structure 150 is formed on the isolation layer 160 in each unit region R. In some embodiments, the backside redistribution circuit structure 150 may include at least one conductor such as conductive trace distributed in at least one layer of dielectric material. The conductive traces may provide a predetermined layout for mapping the required electrical conduction paths. In addition, the backside redistribution circuit structure 150 may be connected to the through via 170 so that the antenna 140 may be electrically connected to the backside redistribution circuit structure 150 through the through via 170.

Figure 8:
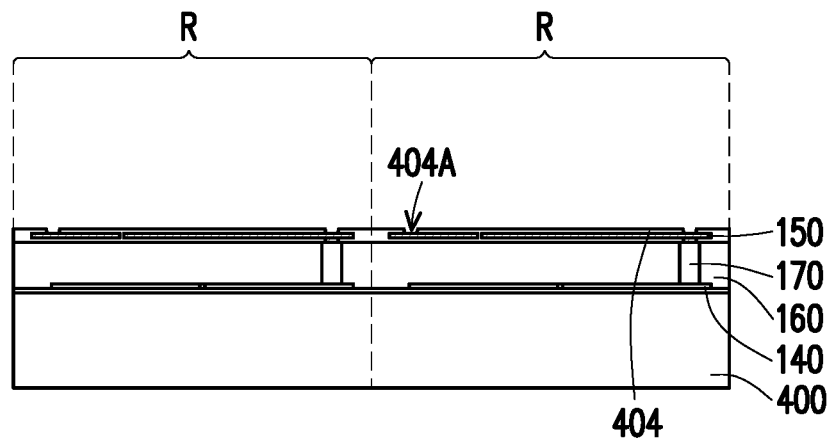
Figure 9:
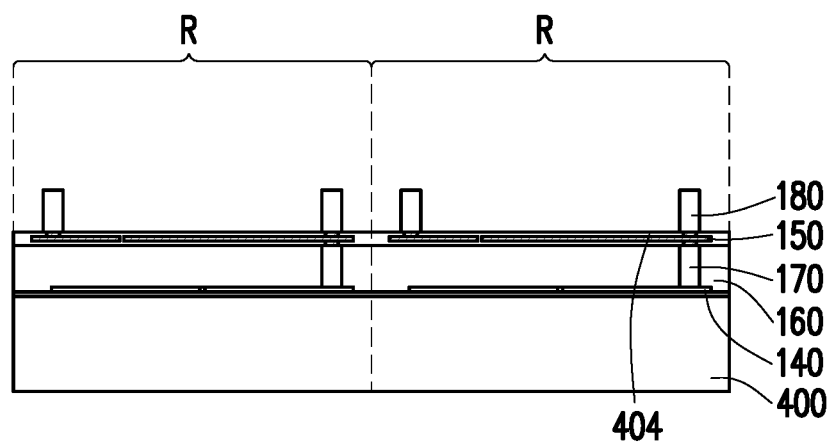

In FIGS. 8 and 9, a dielectric layer 404 is formed on the backside redistribution circuit structure 150 and a through via 180 is subsequently formed on the dielectric layer 404. The dielectric layer 404 may be formed to cover the backside redistribution circuit structure 150 in each unit region R and having openings 404A exposing a portion of the backside redistribution circuit structure 150. The through via 180 is formed on the dielectric layer 404 and in contact with the portion of the backside redistribution circuit structure 150 exposed by the opening 404A so that the through via 180 is electrically connected to the backside redistribution circuit structure 150.

Figure 10:
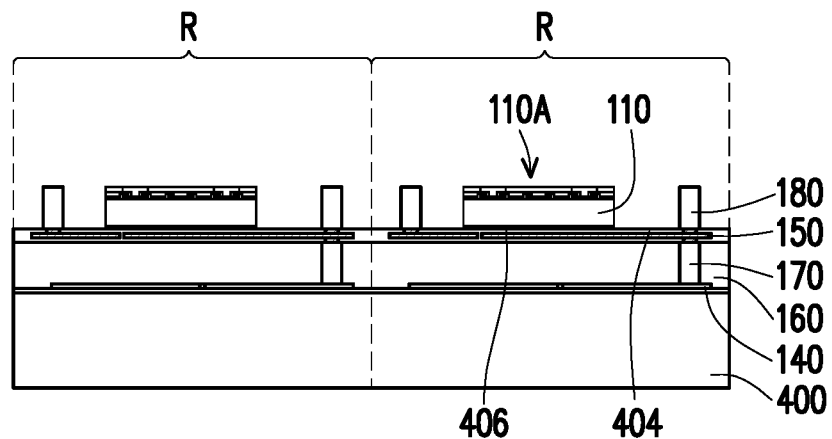

In FIG. 10, an RFIC chip 110 is picked up and placed on the dielectric layer 404 in each unit region R. The RFIC chip 110 is attached on the dielectric layer 404 in a manner the active surface 110A facing upwards as oriented in this illustrative example and the location of the RFIC chip 110 is substantially above the backside redistribution circuit structure 150 and the antenna 140. In some embodiments, the RFIC chip 110 is attached on the dielectric layer 404 by using a die attach film 406.

Figure 11:
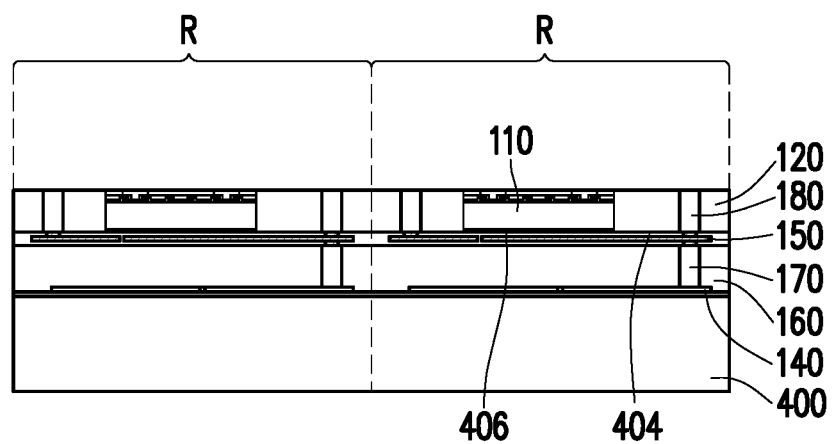

Subsequent to the attachment of the RFIC chip 110 onto the dielectric layer 404, an insulating encapsulation 120 is formed to encapsulate the RFIC chip 110 and the through via 180 as shown in FIG. 11. A material of the insulating encapsulation 120 may be a resin capable of being cured through a thermal cure process or UV cure process. In some embodiments, a material of the insulating encapsulation 120 may be similar to or the same as a material of the isolation layer 160. Subsequent to the encapsulation process, a planarization process may be performed so that the surface of the insulating encapsulation 120 is planar. In some embodiments, the planarization process includes a Chemical-Mechanical Planarization (CMP), a polishing process or the like.

Figure 12:
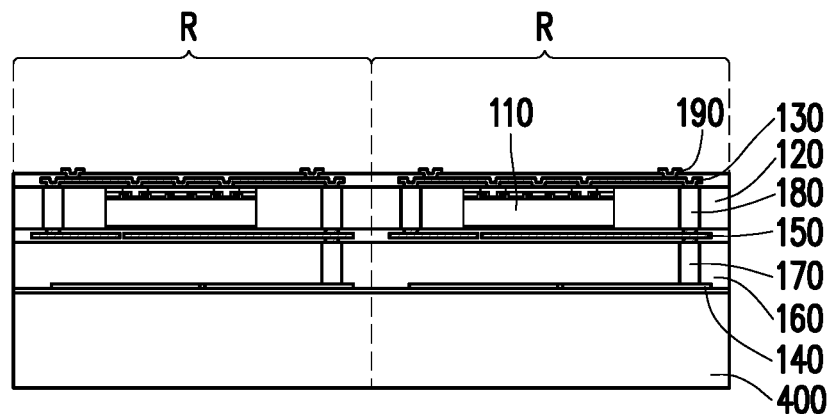
Figure 13:
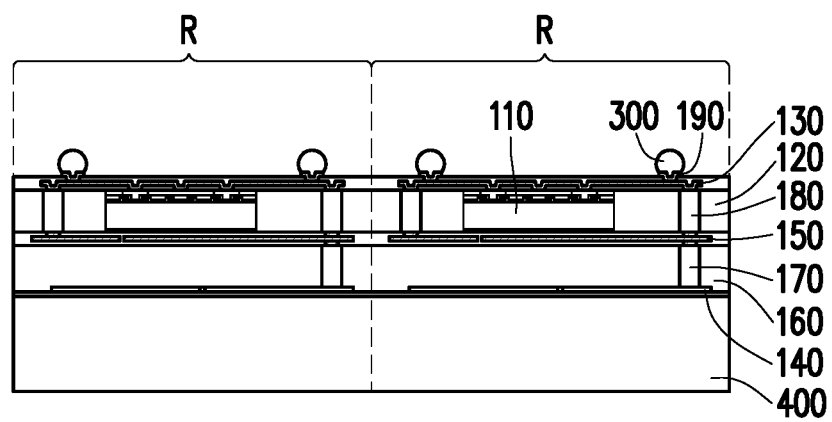

In FIG. 12, a redistribution circuit structure 130 connecting to one RFIC chip 110 is formed on the insulating encapsulation 120. The redistribution circuit structure 130 may include at least one conductor such as copper trace distributed in at least one layer of dielectric material. In an example, the conductive traces may provide a predetermined layout for mapping the electrical conduction paths of the RFIC chip 110 and the through via 180. In some embodiment, the redistribution circuit structure 130 may be electrically connected to the antenna 140 through the through via 180, the backside redistribution circuit structure 150 and the through via 170. In addition, a connecting pad 190 may be formed on the redistribution circuit structure 130 and as shown in FIG. 13, a conductive bump 300 may be formed on the connecting pad 190 for bonding to an external component such as a circuit board. The conductive bump 300 may be controlled collapsing chip connectors ("C4"), solder bumps, or other connectors for connecting to an external device. In some alternative embodiments, the connecting pad 190 may be omitted and the conductive bump 300 may be in direct connected to the conductive traces (not shown) of the redistribution circuit structure 130.

Figure 14:
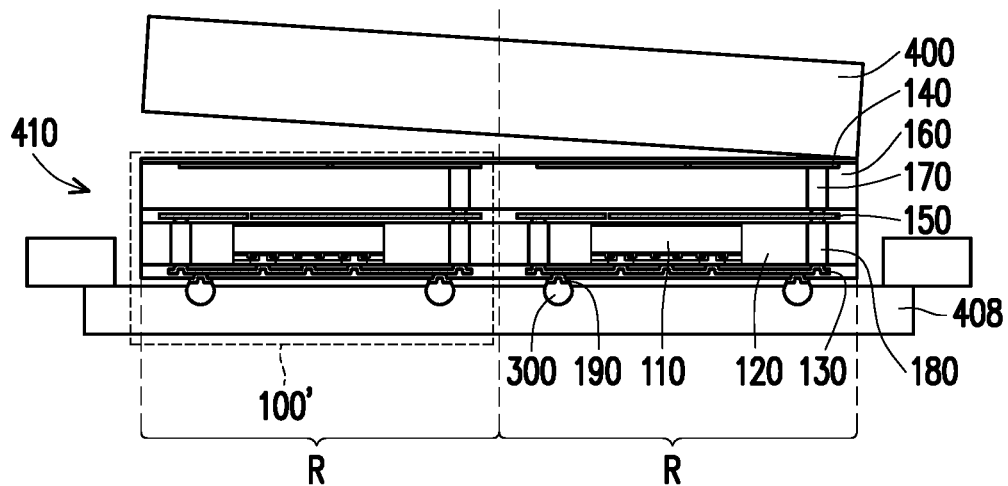

Next, as shown in FIG. 14, the structure fabricated by performing the steps of FIGS. 4 to 13 is mounted on a support frame 408 and a debonding process is performed to remove the carrier 400 to form a package array 410. In some embodiments, the debonding process may include applying an energy beam to the boundary between the carrier 400 and the package array 410 where a temporary adhesive layer may be formed. The energy beam may be a laser beam with sufficient energy to deteriorate the adhesive property of the temporary adhesive layer, such that the carrier 400 can be removed from the package array 410. The package array 410 may include a plurality of INFO package units 100'. The INFO package units 100' are connected to one another, where the isolation layer 160 and the insulating encapsulation 120 may continuously extend among the INFO package units 100'. In addition, each of the INFO package units 100' includes the RFIC chip 110, the redistribution circuit structure 130 and the antenna 140, where the antenna 140 is electrically connected to the RFIC chip 110 through the redistribution circuit structure 130 as well as the backside redistribution circuit structure 150, the through via 170 and the through via 180. The insulating encapsulation 120 may encapsulate the RFIC chip 110 and surround the through via 180 between the redistribution circuit structure 130 and the backside redistribution circuit structure 150. The isolating layer 160 is formed between the antenna 140 and the backside redistribution circuit structure 150 and surrounds the through via 170.

Figure 15:
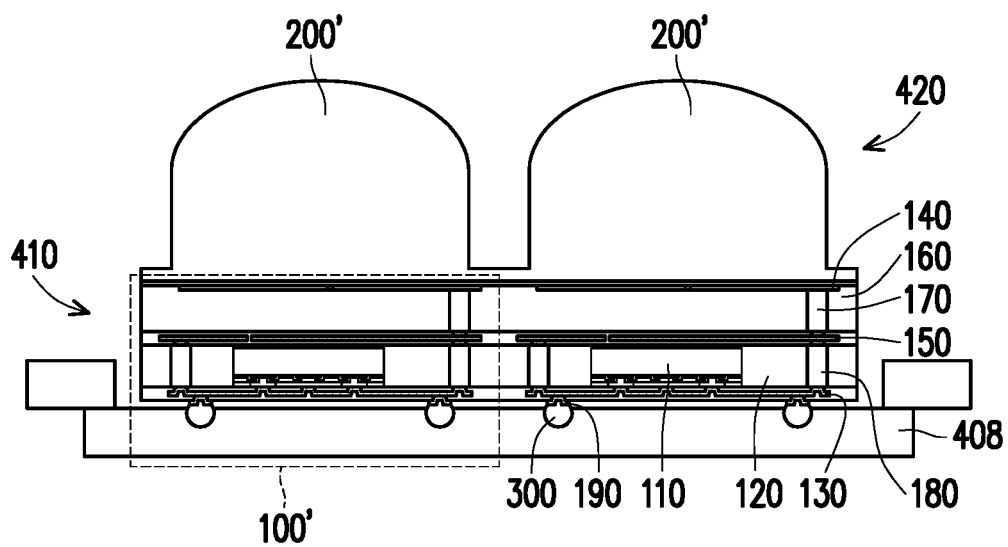

Thereafter, as shown in FIG. 15, a microwave director array 420 including a plurality of microwave directors 200' connected to one another is formed on the package array 410. The microwave director array 420 is formed on the package array 410 in a manner that each microwave director 200' is located above one of the INFO package units 100'. In some embodiments, the INFO package units 100' do not share the microwave director 200' and one microwave director 200' may be substantially located over a single INFO package unit 100'. In some embodiments, a number of the INFO packages 100 may be identical to a number of the microwave directors 200'.

Figure 16:
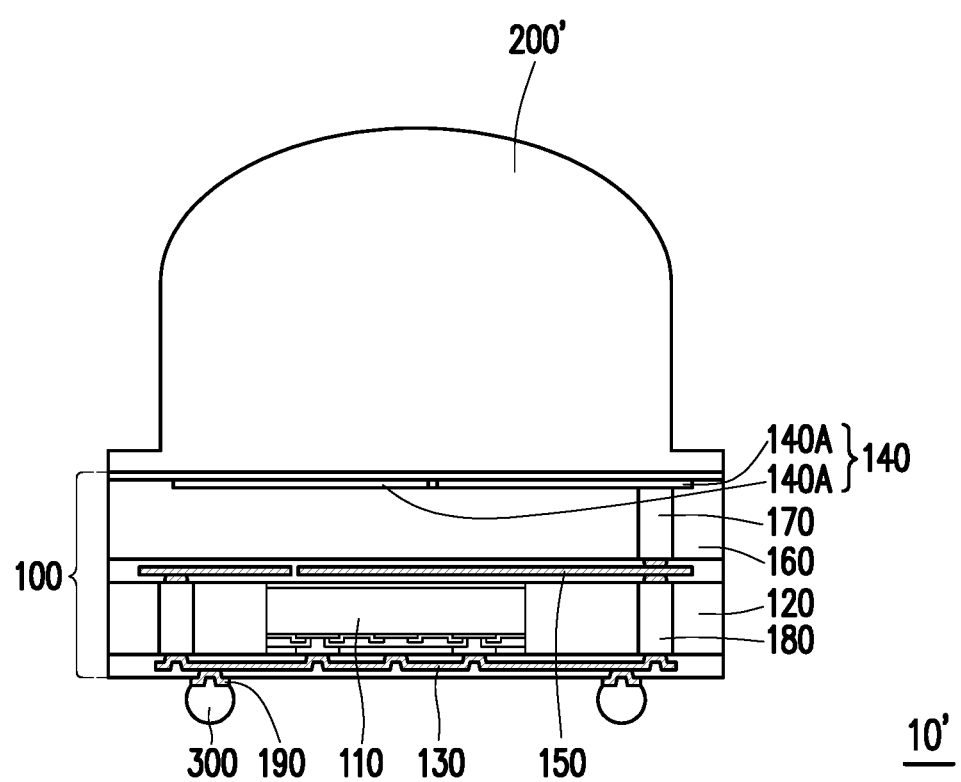

Subsequently, a singulation process may be performed to cut the package array 410 with the microwave director array 420 thereon into a package structure 10' as shown in FIG. 16. The package structure 10' includes an INFO package 100 and a microwave director 200' thereon. In some embodiments, by modifying the cutting path of the singulation process, the package structure 10' may include multiple INFO packages 100 and multiple microwave directors 200', wherein the multiple INFO packages 100 may be integrally packaged by using a common isolation layer and a common insulating encapsulation, and each microwave director 200' may be located above one INFO package 100, such that one antenna 140 may be located between one microwave director 200' and one RFIC chip 110. In some embodiments, the microwave director 200' may have a structure similar to the microwave director 200 shown in FIG. 1. In some alternative embodiments, the microwave director 200' may have a structure similar to the microwave director 202 shown in FIG. 3. In some further embodiments, the microwave director 200' may have other structures capable of directing the microwave received or generated by the antenna 140.

Figure 17:
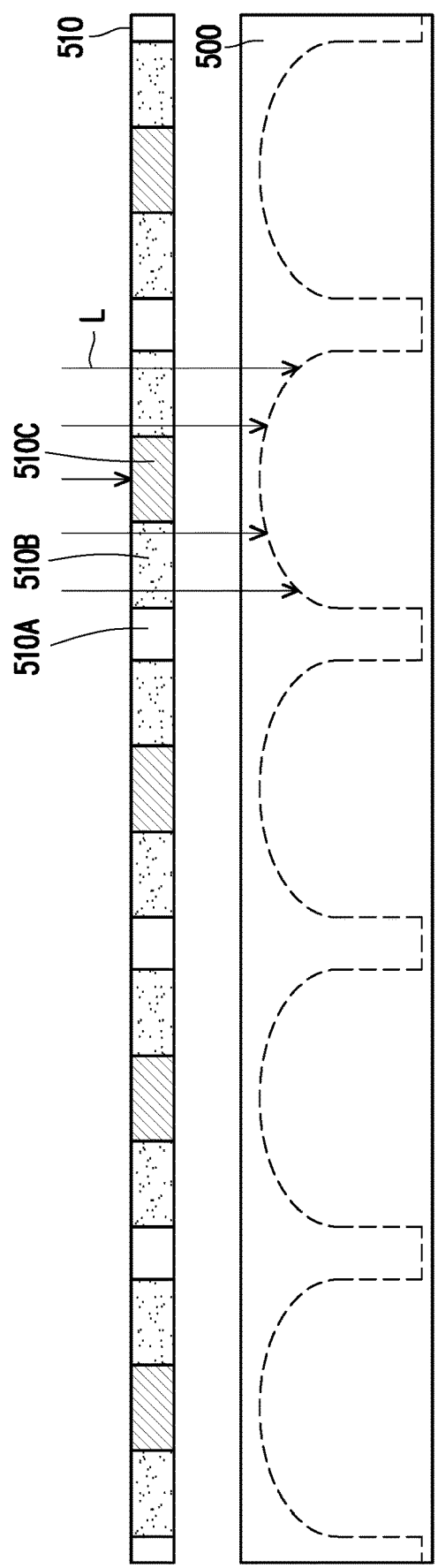
FIG. 17 and FIG. 18 schematically illustrate a method of fabricating a microwave director in accordance with some embodiments of the disclosure.
Figure 18:
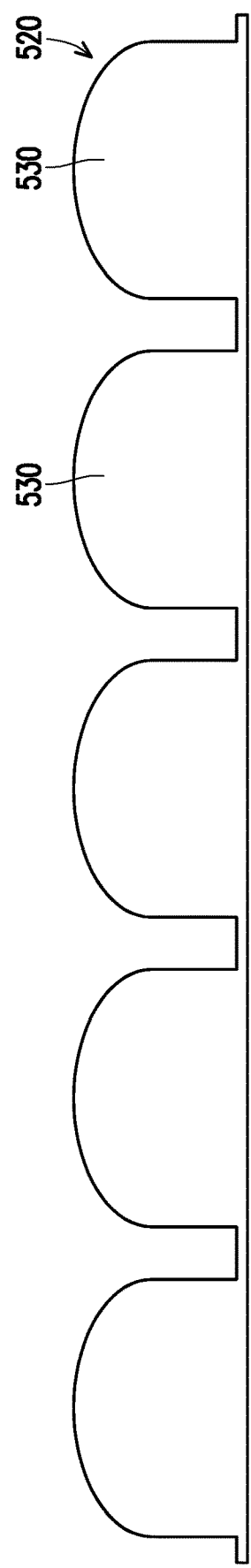

FIG. 17 and FIG. 18 schematically illustrate a method of fabricating a microwave director in accordance with some embodiments of the disclosure. As shown in FIG. 17, an irradiating process is performed on a photosensitive dielectric material layer 500 using a gray tone mask 510. The gray tone mask 510 is located between a light source (not shown) and the photosensitive dielectric material layer 500 and a light L from the light source (not shown) passes the gray tone mask 510 prior to irradiate onto the photosensitive dielectric material layer 500. The gray tone mask 510 may include a plurality of sections 510A, 510B and 510C, where a transmittance of the section 510A is greater than a transmittance of the section 510B and the transmittance of the section 510B is greater than a transmittance of the section 510C. Therefore, portions of the photosensitive dielectric layer 500 corresponding to the sections 510A, 510B and 510C are subjected to different light irradiation intensities. After the irradiating process, a developing process and a curing process are performed to form a microwave director array 520 having a plurality of microwave directors 530 connected to one another as shown in FIG. 18. In some embodiment, the microwave director array 520 may be served as the microwave director array 420 in the process depicted in FIG. 15.

Figure 19:
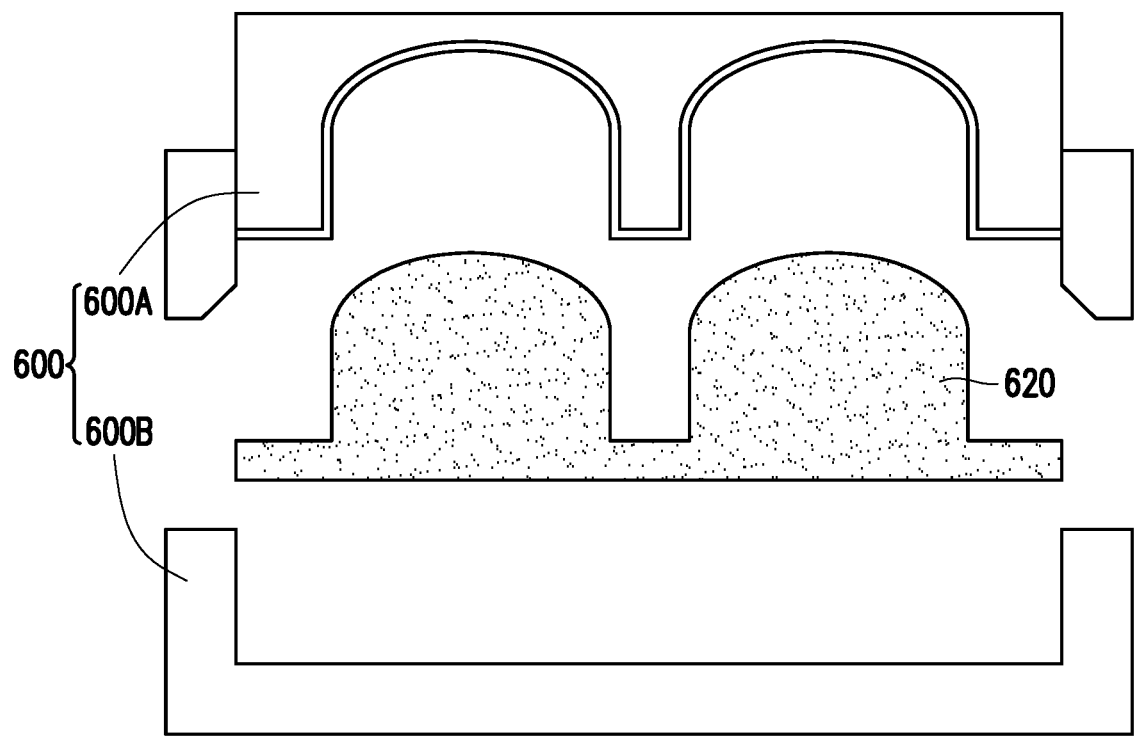
FIG. 19 schematically illustrates a method of fabricating a microwave director in accordance with some embodiments of the disclosure.

FIG. 19 schematically illustrates a method of fabricating a microwave director in accordance with some embodiments of the disclosure. In FIG. 19, a molding fixture 600 including mold portions 600A and 600B is used to form the microwave director array 620. A space may be defined by the mold portions 600A and 600B and a moldable material may be filled in the space defined by the mold portions 600A and 600B. Subsequently, the moldable material is cured to have the shape defined by the molding portions 600A and 600B, and separated from the molding fixture 600 to form the microwave director array 620. In some embodiment, the microwave director array 620 may be served as the microwave director array 420 in the process depicted in FIG. 15.

Figure 20:
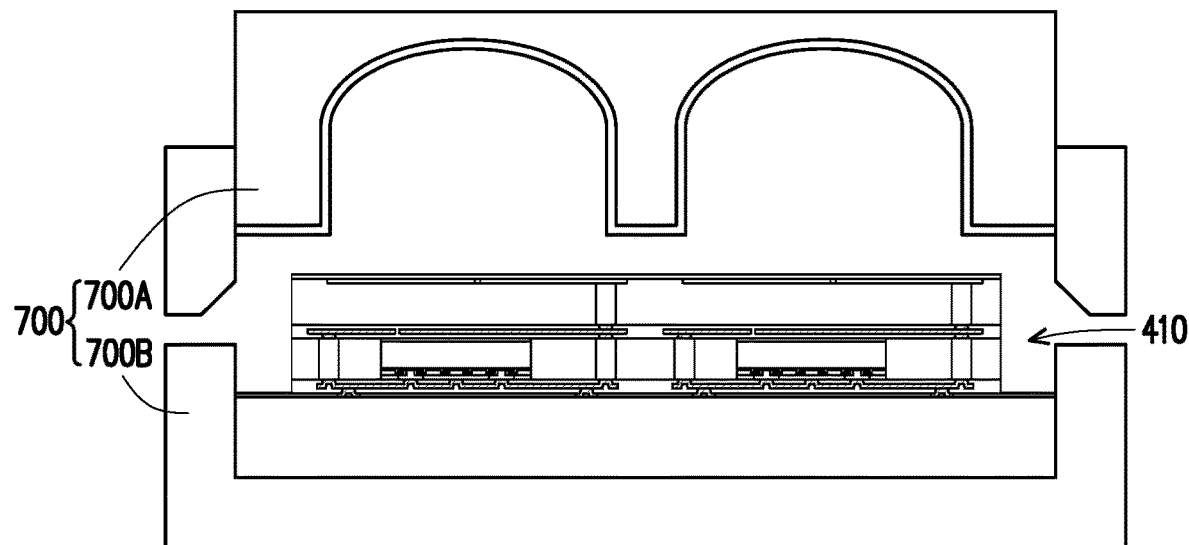
FIG. 20 and FIG. 21 schematically illustrate a method of forming a microwave director array on a package array in accordance with some embodiments of the disclosure.
Figure 21:
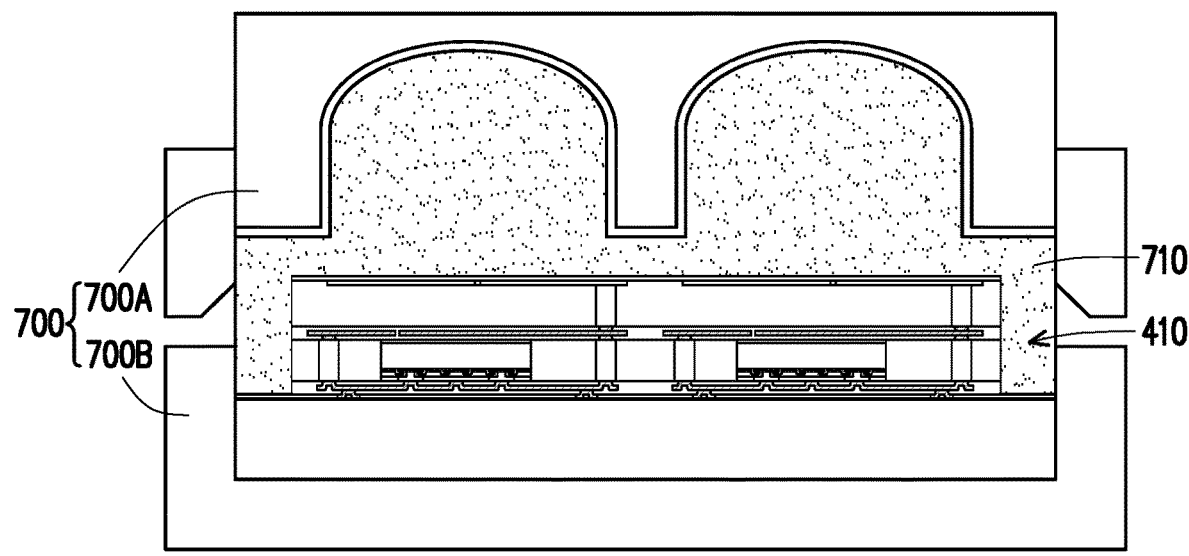

FIG. 20 and FIG. 21 schematically illustrate a method of forming a microwave director array on a package array in accordance with some embodiments of the disclosure. In FIG. 20, the package array 410 similar to that depicted in FIG. 14 is placed in a molding fixture 700. The molding fixture 700 may include the mold portions 700A and 700B. A space may be defined between the mold portions 700A and 700B when the package array 410 is placed between the mold portions 700A and 700B. In FIG. 21, a moldable material 710 may be filled in the space defined by the mold portions 700A and 700B. Subsequently, the moldable material 710 is cured to have the shape defined by the mold portions 700A and 700B, and separated from the molding fixture 700 to form the microwave director array (not shown). In some embodiment, the microwave director array 420 in the process depicted in FIG. 15 may be fabricated by using the process of FIGS. 20 and 21.

Figure 22:
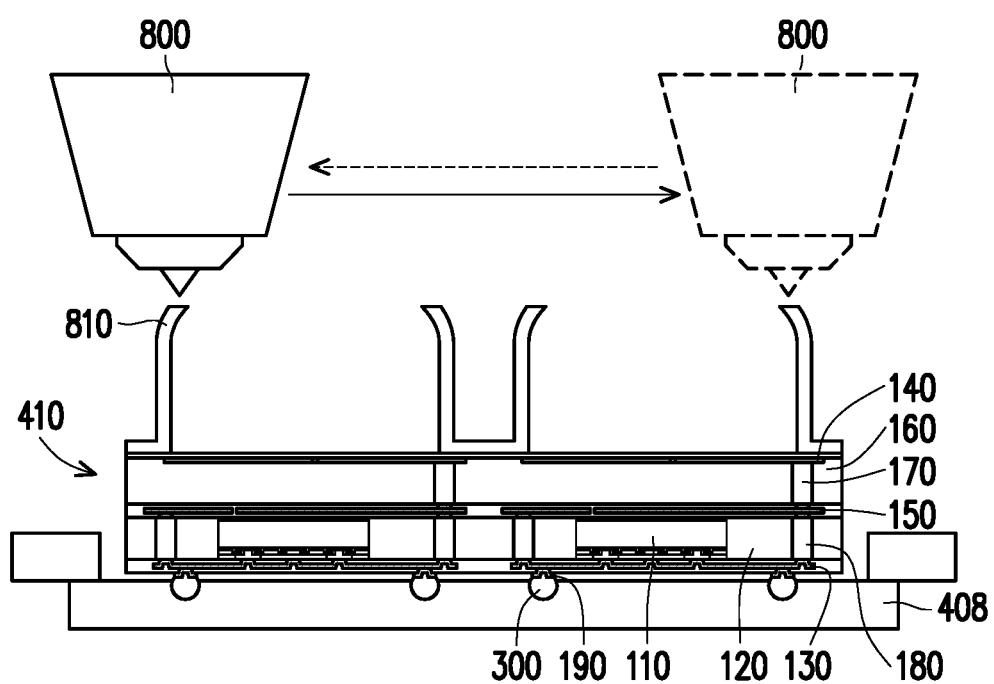
FIG. 22 and FIG. 23 schematically illustrate a method of forming a microwave director array on a package array in accordance with some embodiments of the disclosure.
Figure 23:
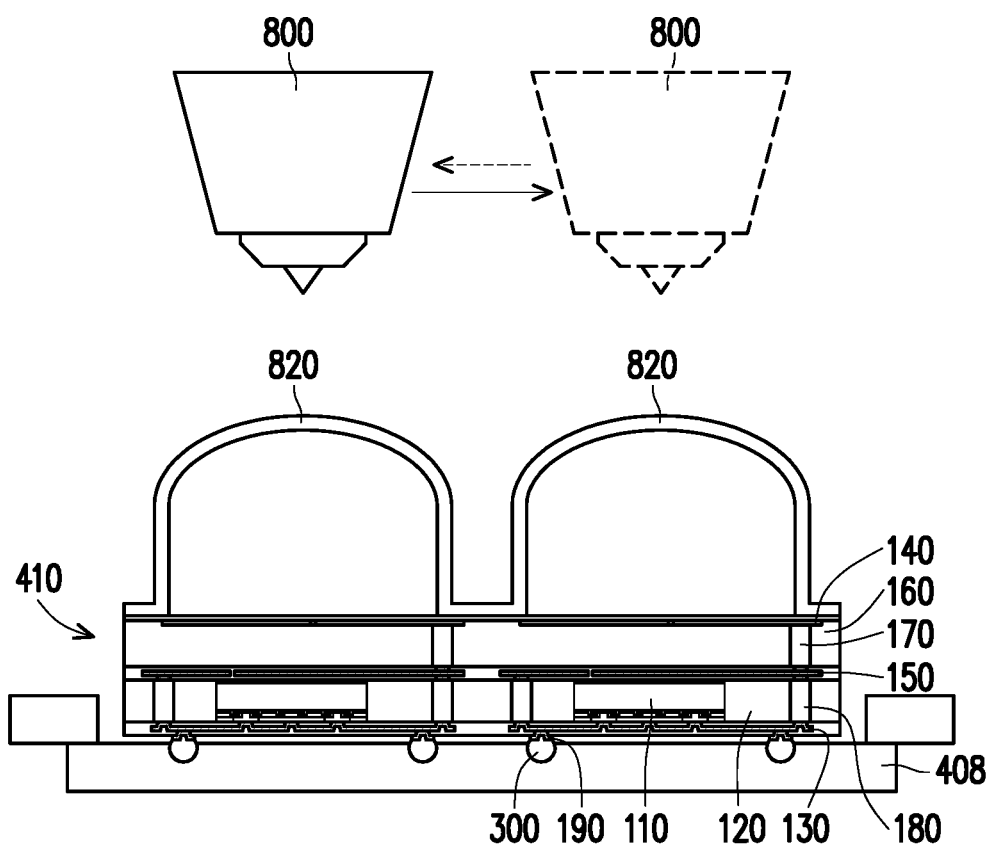

FIG. 22 and FIG. 23 schematically illustrate a method of forming a microwave director array on a package array in accordance with some embodiments of the disclosure. In FIGS. 22 and 23, a three dimensional printing apparatus 800 is used for forming the printing material 810 on the package array 410. The package array 410 may be similar to that depicted in FIG. 14. In addition, the printing material 810 is printed in a predetermined path by the three dimensional printing apparatus 800 so as to form the microwave director array 820 on the package array 410 as shown in FIG. 23. In some embodiment, the microwave director array 820 fabricated by using the process depicted in FIGS. 22 and 23 may be served as the microwave director array 420 in the process depicted in FIG. 15. In addition, the microwave director 202 depicted in FIG. 3 may be fabricated by using the process of FIGS. 22 and 23.

Figure 24:
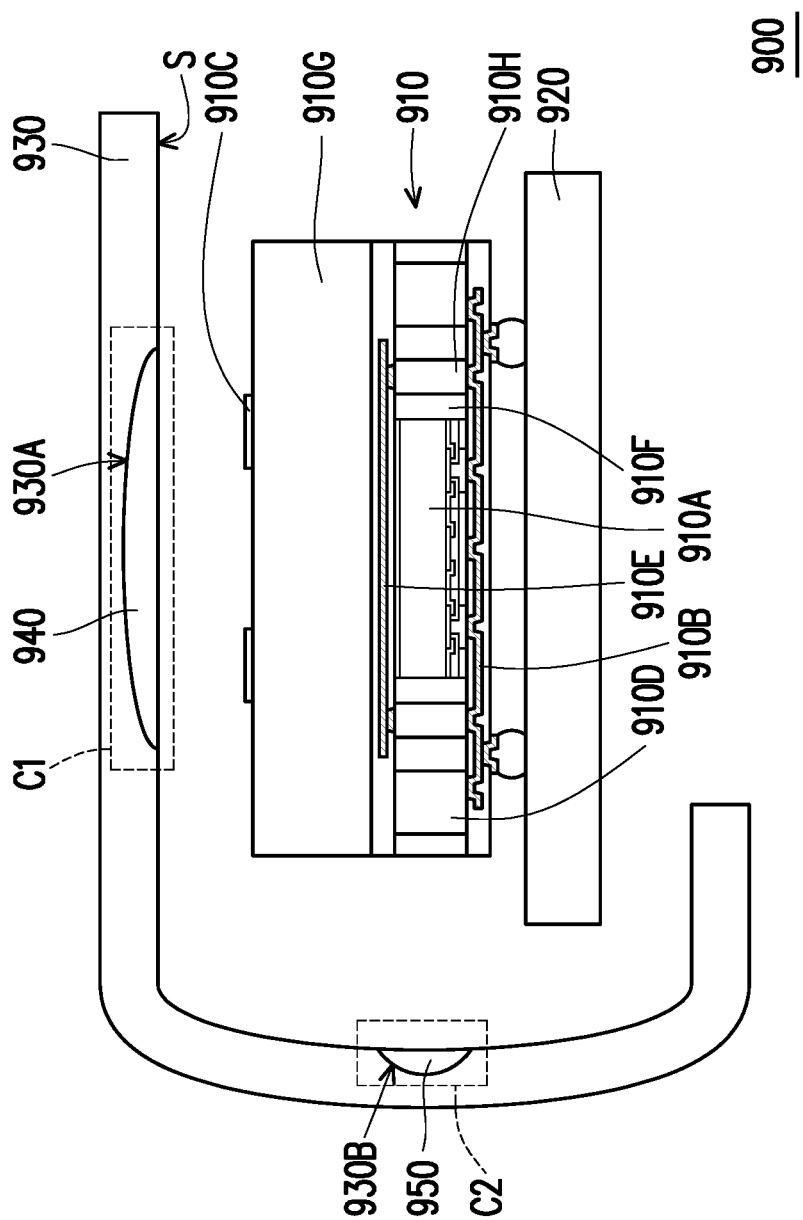
FIG. 24 schematically illustrates a portion of an electronic device in accordance with some embodiments of the disclosure.

FIG. 24 schematically illustrates a portion of an electronic device in accordance with some embodiments of the disclosure. As shown in FIG. 24, an electronic device 900 includes an INFO package 910 bonded on a board 920 and a housing 930. The INFO package 910 on the board 920 is disposed in an inner space of the housing 930 and includes an RFIC chip 910A, a redistribution circuit structure 910B, a first antenna 910C and a second antenna 910D. The first antenna 910C and the second antenna 910D are electrically connected to the RFIC chip 910A through the redistribution circuit structure 910B. The first antenna 910C is located at the back side of the RFIC chip 910A and the second antenna 910D is located at the lateral side of the RFIC chip 910A, where the back side of the RFIC chip 910A is opposite to the active surface of the RFIC chip 910A. The housing 930 has a first microwave directivity enhancement surface 930A located in a propagating path of a microwave received or generated by the first antenna 910C and a second microwave directivity enhancement surface 930B located in a propagating path of a microwave received or generated by the second antenna 910D.

The housing 930 has a concave structure C1 and a concave structure C2 at the inner surface S of the housing 930. The concave structure C1 is positioned facing the first antenna 910C to provide the first microwave directivity enhancement surface 930A. The concave structure C2 is positioned facing the second antenna 910D to provide the second microwave directivity enhancement surface 930B. The first antenna 910C is substantially positioned between the first microwave directivity enhancement surface 930A and the RFIC chip 910A and the second antenna 910D is substantially positioned between the second microwave directivity enhancement surface 930B and the RFIC chip 910A. In some embodiments, a dielectric material 940 may fill the concave structure C1 and a dielectric material 950 may fill the concave structure C2. The dielectric materials 940 and 950 may be the same material or different materials and may allow a microwave to pass it through. A material of the housing 930 may be different from the dielectric material 940 and the dielectric material 950. In addition, the portion of the housing 930 having the concave structure C1 as well as the portion of the housing having the concave structure C2 may be made of dielectric material.

The INFO package 910 may further include a backside redistribution circuit structure 910E, an insulating encapsulation 910F, an isolation layer 910G and a through via 910H. The insulating encapsulation 910F encapsulates the RFIC chip 910A and the second antenna 910D. The backside redistribution circuit structure 910E is disposed on the insulating encapsulation 910F and located between the first antenna 910C and the RFIC chip 910A. The isolation layer 910G is formed between the backside redistribution circuit structure 910E and the first antenna 910C. The backside redistribution circuit structure 910E may be electrically connected to the redistribution circuit structure 910B through the through via 910H and the first antenna 910C may be electrically connected to the backside redistribution circuit structure 910E through another through via (not shown) such that the first antenna 910C is electrically connected to the redistribution circuit structure 910B.

Figure 25:
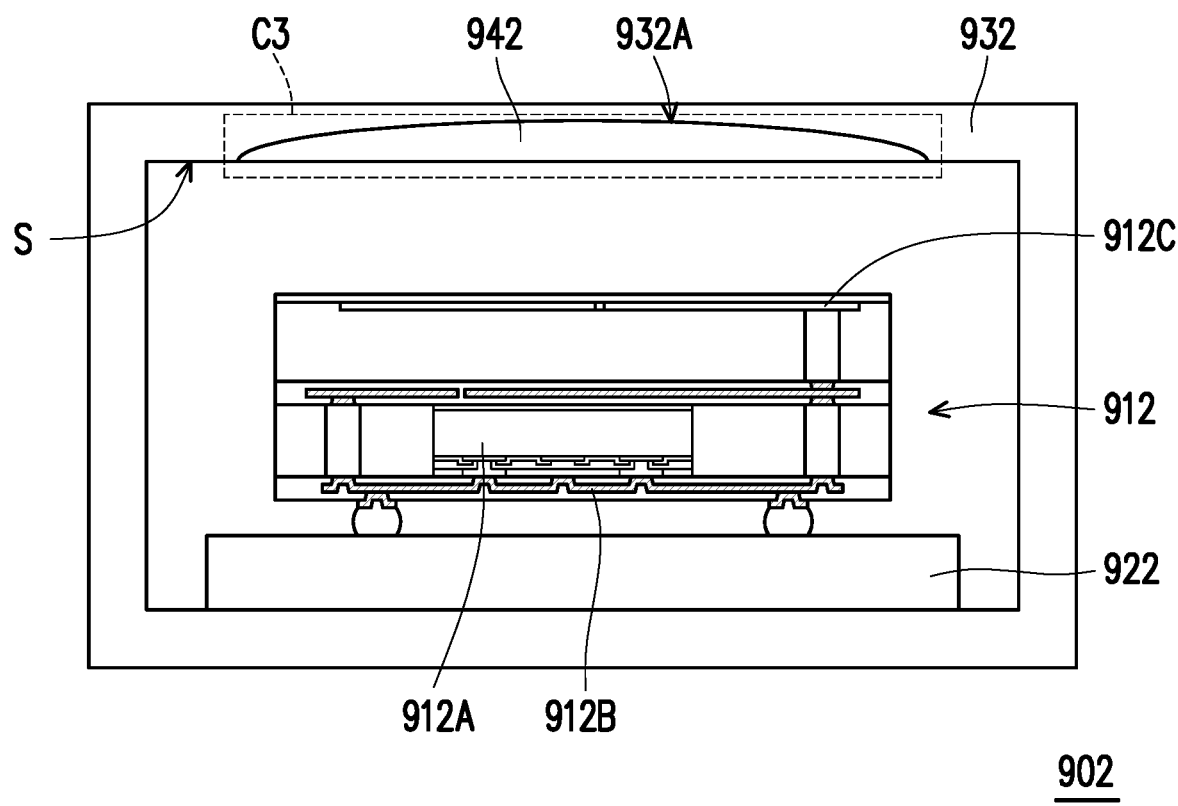
FIG. 25 schematically illustrates a cross section of an electronic device in accordance with some embodiments of the disclosure.

FIG. 25 schematically illustrates a cross section of an electronic device in accordance with some embodiments of the disclosure. In FIG. 25, an electronic device 902 includes an INFO package 912 bonded on a board 922 and a housing 932. The INFO package 912 on the board 922 is disposed in an inner space of the housing 932 and includes an RFIC chip 912A, a redistribution circuit structure 912B, and an antenna 912C. The antenna 912C is electrically connected to the RFIC chip 912A through the redistribution circuit structure 912B. The antenna 912C is located at the back side of the RFIC chip 912A, where the back side of the RFIC chip 912A is opposite to the active surface of the RFIC chip 912A. The housing 932 has a first microwave directivity enhancement surface 932A located at a propagating path of a microwave received or generated by the antenna 912C. The housing 932 forms a close volume and has a rectangular ring shape in the cross section in some embodiments, but the disclosure is not limited thereto.

The housing 932 has a concave structure C3 at the inner surface S. The concave structure C3 is positioned facing the antenna 912C to provide the first microwave directivity enhancement surface 932A. In some embodiments, a dielectric material 942 may fill the concave structure C3. The dielectric material 942 may allow a microwave to pass it through. In addition, the portion of the housing 932 having the concave structure C3 may be made of dielectric material allowing a microwave to pass it through.

In some embodiments, the INFO packages 910 and 912 may be similar to the INFO package 100 depicted in FIG. 1. The electronic devices 900 and 902 may be portable devices or non-portable devices. For example, the electronic devices 900 and 902 may include a cellular phone, a smart phone, a smart pad, a tablet, a smart watch, a personal digital assistant, a portable multimedia player, an MP3 player, an e-book, a television, a computer monitor, a laptop, a tablet, a digital camera, a camcorder, a game console, a consumer appliance, an automobile, etc.

In accordance with some embodiments of the present disclosure, A method including the following steps is provided. A reconstructed wafer including a plurality of INFO package units arranged in array is provided, wherein each of the INFO package units includes an RFIC chip and an antenna electrically connected to the RFIC chip. A microwave director array including a plurality of microwave directors is formed over the reconstructed wafer, wherein each of the microwave directors is located over one of the INFO package units respectively. A singulation process is performed to cut the reconstructed wafer and the microwave director array on the reconstructed wafer so as to obtain a plurality of singulated package structures.

In accordance with some embodiments of the present disclosure, a method including the following steps is provided. A package array including a plurality of INFO package units, wherein each INFO package unit includes an RFIC chip and an antenna electrically connected to the RFIC chip. A microwave director array including a plurality of microwave directors is formed over the package array, wherein each of the microwave directors being located over one of the INFO package units respectively. Each of the microwave directors comprises a base portion, an extension portion and a lens portion, the extension portion is located between the lens portion and the antenna, the base portion is located between the extension portion and the antenna, the base portion exceeds the extension portion on the antenna, and the lens portion has the microwave directivity enhancement surface.

In accordance with some embodiments of the present disclosure, a method of fabricating a package structure includes at least the following steps. A package array including a plurality of INFO package units is formed, wherein each of the INFO package units includes a radio frequency integrated circuit (RFIC) chip, a redistribution circuit structure and an antenna, and the antenna is electrically connected to the RFIC chip through the redistribution circuit structure. A microwave director array on the package array is formed, wherein the microwave director array includes a plurality of microwave directors and each of the microwave directors is located on one of the INFO packages. A singulation process is performed to cut the package array with the microwave director array thereon into a package structure, wherein an antenna of the package structure is located between an RFIC chip of the package structure and a microwave director of the package structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a radio frequency integrated circuit (RFIC) chip;
   an insulating encapsulation encapsulating the RFIC chip;
   an antenna disposed on the insulating encapsulation and electrically connected to the RFIC chip; and
   a microwave director comprising a base portion, an extension portion and a lens portion, wherein the extension portion is located between the lens portion and the antenna, the base portion is located between the extension portion and the antenna, the base portion exceeds the extension portion on the antenna, and the lens portion has a microwave directivity enhancement surface located in a propagating path of a microwave received or generated by the antenna.

2. The structure of claim 1, wherein the antenna comprises a plurality of patches located within an area of an orthogonal projection of the microwave directivity enhancement surface on a plane of the antenna.

3. The structure of claim 1, wherein a width of the extension portion is substantially constant in a direction away from the antenna, and a width of the lens portion is gradually reduced in the direction away from the antenna.

4. The structure of claim 1, wherein a flange portion of the base portion exceeding the extension portion has an inner periphery and an outer periphery, an area surrounded by the inner periphery is A1, an area surrounded by the outer periphery is A2, and 0.5*A2≤A1≤A2.

5. The structure of claim 4, wherein an area of the microwave directivity enhancement surface is located within the area surrounded by the inner periphery.

6. The structure of claim 1, wherein a hollow space is demarcated by the microwave director.

7. The structure of claim 1, wherein the microwave directivity enhancement surface comprises a spherical surface or an aspherical surface.

8. The structure of claim 1 further comprising an isolation layer disposed between the RFIC chip and the antenna.

9. An electronic device, comprising:
   a package comprising an RFIC chip and an antenna, wherein the antenna is electrically connected to the RFIC chip; and
   a housing, wherein the package is disposed in an inner space demarcated by the housing, and the housing has a microwave directivity enhancement surface facing the antenna.

10. The electronic device of claim 9, wherein the housing comprises a concave structure located at an inner surface of the housing, and the concave structure provides the microwave directivity enhancement surface.

11. The electronic device of claim 10, wherein a dielectric material is filled in the concave structure.

12. The electronic device of claim 9, wherein a portion of the housing having the microwave directivity enhancement surface is made of a dielectric material.

13. The electronic device of claim 9, wherein the package includes a first antenna located at a first side of the RFIC chip and a second antenna located at a second side of the RFIC chip, the housing has a first microwave directivity enhancement surface facing the first antenna and a second microwave directivity enhancement surface facing the second antenna, and the first side is opposite to an active surface of the RFIC chip and the second side is a lateral side of the RFIC chip.

14. A method, comprising:
   laterally encapsulating a plurality of radio frequency integrated circuit (RFIC) chips arranged in array with an insulating encapsulation;
   forming an isolation layer over the plurality of RFIC chips laterally encapsulated by the insulating encapsulation;
   forming a plurality of antennae disposed on the insulating encapsulation and over the isolation layer, each antenna among the plurality of antennae being electrically connected to one RFIC chip among the plurality of RFIC chips;
   forming a microwave director array comprising a plurality of microwave directors over the isolation layer, each of the microwave directors being located over one RFIC chip among the plurality of RFIC chips, respectively, wherein each of the microwave directors is formed to comprise a base portion, an extension portion and a lens portion, the extension portion is located between the lens portion and the antenna, the base portion is located between the extension portion and the antenna, the base portion exceeds the extension portion on the antenna, and the lens portion has the microwave directivity enhancement surface located in a propagating path of a microwave received or generated by the antenna; and
   performing a singulation process to singulate the plurality of RFIC chips laterally encapsulated by the insulating encapsulation and the microwave director array.

15. The method of claim 14, wherein the microwave directors in the microwave director array are connected to one another before performing the singulation process.

16. The method of claim 14, wherein forming the microwave director array over the isolation layer comprises:
   forming a photosensitive dielectric material layer over the isolation layer; and
   partially removing the photosensitive dielectric material layer by a photolithography process to form the microwave directors over the isolation layer.

17. The method of claim 16, wherein partially removing the photosensitive dielectric material layer by the photolithography process comprises performing an irradiating process, a developing process, and a curing process on the photosensitive dielectric material layer.

18. The method of claim 14, wherein the microwave director array is formed by a molding process or a 3D (three dimensional) printing process.

19. The method of claim 14, wherein a dissipation factor (DO of the isolation layer is equal to or less than 0.01.

20. The method of claim 14, wherein a flange portion of the base portion exceeding the extension portion has an inner periphery and an outer periphery, an area surrounded by the inner periphery is A1, an area surrounded by the outer periphery is A2, and 0.5*A2≤A1≤A2.

* * * * *